United States Patent
Zhu et al.

(10) Patent No.: US 9,183,078 B1
(45) Date of Patent: Nov. 10, 2015

(54) PROVIDING ERROR CHECKING AND CORRECTING (ECC) CAPABILITY FOR MEMORY

(71) Applicant: Marvell International Ltd., Hamilton (BM)

(72) Inventors: Jun Zhu, San Jose, CA (US); Joseph Jun Cao, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 190 days.

(21) Appl. No.: 13/859,219

(22) Filed: Apr. 9, 2013

Related U.S. Application Data (60) Provisional application No. 61/622,404, filed on Apr. 10, 2012.

(51) Int. Cl.
*G06F 13/20* (2006.01)
*G11C 16/10* (2006.01)
*G06F 11/10* (2006.01)

(52) U.S. Cl.
CPC .................................... *G06F 11/10* (2013.01)

(58) Field of Classification Search
CPC ... G06F 11/10; G06F 11/1068; G06F 3/0614; G06F 3/0679; G11C 7/1006; G11C 11/56; H03M 13/2906; H03M 13/2927

USPC .......... 714/E11.034, 758, 763, 776, 807, 746, 714/777, 782, 752, 751; 365/185.33, 365/185.09; 711/100, 114, 170
See application file for complete search history.

(56) References Cited

U.S. PATENT DOCUMENTS

| | | | | |
|---|---|---|---|---|
| 5,978,952 | A | * | 11/1999 | Hayek et al. .................. 714/764 |
| 6,079,047 | A | * | 6/2000 | Cotugno et al. .............. 714/807 |
| 8,635,416 | B1 | * | 1/2014 | de la Iglesia ................. 711/154 |
| 2007/0079212 | A1 | * | 4/2007 | Har-Chen et al. ............. 714/758 |
| 2012/0110261 | A1 | * | 5/2012 | Cho .............................. 711/114 |

OTHER PUBLICATIONS

International Business Machines Corporation, "IBM Chipkill Memory", *Enhancing IBM Netfinity Server Reliability*, 2009, pp. 1-6.

* cited by examiner

*Primary Examiner* — Phung M Chung

(57) ABSTRACT

In some implementations, a memory controller is configured receive a data word to be stored in the memory, generate error checking and correcting (ECC) information for the data word, the data word and ECC information forming an encoded word, and distribute bits of the encoded word across the plurality of concurrently accessible memory devices in accordance with one or more indications specifying a number of the bits of the encoded word to store in a wordline of each of the plurality of concurrently accessible memory devices, wherein bits of the data word are to be stored in two or more memory devices of the plurality of memory devices, and bits of the ECC information are to be stored in two or more memory devices of the plurality of memory devices.

21 Claims, 9 Drawing Sheets

PROVIDING ERROR CHECKING AND CORRECTING (ECC) CAPABILITY FOR MEMORY

CROSS REFERENCE TO RELATED APPLICATION

This disclosure claims the benefit of priority under 35 U.S.C. §119(e) of U.S. Provisional Application No. 61/622,404, filed on Apr. 10, 2012, and titled "Method and Apparatus for Performing Advanced Error Checking and Correcting (ECC) in a Memory System," the disclosure of which is hereby incorporated by reference in its entirety.

FIELD OF USE

The present disclosure relates to error checking and correcting (ECC) in a memory.

BACKGROUND

A memory module, such as a dual in-line memory module (DIMM), may include multiple memory integrated circuits or chips, such as dynamic random-access memory (DRAM) chips. A memory module that does not include error checking and correcting capability (referred to as non-ECC memory) typically includes 8 chips per side for storing data. A memory module may be designed with one or more independent sets of memory chips connected to the same address and data buses. Each such set of memory chips is referred to as a rank. Because all ranks of a memory module share the same buses, only one rank may be accessed at a time.

A memory module may include ×4 (by 4) memory chips or ×8 (by 8) memory chips. "×4" or "×8" refer to the data width of the memory chips in bits. For a ×4 memory module, each memory chip has a data width of 4 bits, which provides 4 data bits on each access. A ×4 memory module with 8 chips per side has a data width of 32 bits per side. A memory controller that accesses 64 bits of data at a time needs to access both sides of an 8-chip ×4 memory module at the same time to read or write the data. A two-sided memory module where both sides are accessed at the same time is a single-ranked memory module.

For a ×8 memory module, each memory chip has a data width of 8 bits, which provides 8 data bits on each access. A ×8 memory module with 8 chips per side has a data width of 64 bits per side. A memory controller that accesses 64 bits of data at a time accesses one side of an 8-chip ×8 memory module at a time to read or write the data. A two-sided memory module where one side is accessed at a time is a dual-ranked memory module.

A memory module may include ECC capability to detect and correct bit errors in data stored in the memory module. A memory module that includes ECC capability (referred to as an ECC memory) encodes data by generating ECC bits, e.g., redundancy bits or parity bits, that are stored along with the data in the memory module. A conventional ECC memory may use a Single Error Correct, Double Error Detect (SEC-DED) algorithm to detect and correct single-bit errors and detect, but not correct, double-bit errors in a data word. A data word as used in this disclosure is the largest unit of data, not including the ECC bits, that can be transferred to and from a memory module in a single operation. Enhanced Hamming Code, which generates 7 Hamming check bits and 1 parity bit, may be used to provide SEC-DED protection for each data word.

An ECC memory typically includes 9 chips per side for storing data and ECC bits that can be used to detect and correct errors in the data. An ECC memory can also include an interface that can provide simultaneous access of a data word and its corresponding ECC bits. A data word and its corresponding ECC bits are referred to as an encoded word. For example, an ECC memory that can provide 8 ECC bits for each 32-bit data word may include a 40-bit wide interface to access a 40-bit encoded word. Similarly, an ECC memory that can provide 8 ECC bits for each 64-bit data word may include a 72-bit wide interface to access a 72-bit encoded word.

Because conventional ECC algorithms, such as SEC-DED, detect and correct single-bit errors in a data word, an unrecoverable data loss can occur when multiple bits in a data word are in error or when a memory chip on a memory module fails. In either situation, the number of bits in error is greater than the number of bits protected by a conventional ECC memory. For example, when a ×8 memory chip fails, a conventional ECC memory cannot recover the 8 bits of data that are lost because a conventional ECC memory only protects against single-bit failures.

To prevent unrecoverable data loss, ECC memories have been designed to protect data from single memory chip failures and multi-bit errors from a single memory chip (referred to as advanced ECC). In such an advanced ECC memory, the bits of an encoded word are distributed across multiple memory chips such that failure of or multi-bit errors from a single memory chip will affect only one bit in an encoded word. Each bit that is stored on a memory chip corresponds to a different encoded word. For example, if an advanced ECC memory included ×4 memory chips, each of the 4 bits provided by the memory chip during a read operation would correspond to a different encoded word. Thus, even in the case of an entire memory chip failure, an encoded word will have no more than one bit of bad data, which can be corrected using conventional ECC algorithms such as SEC-DED.

As an example, a 72-bit encoded word may be protected from unrecoverable data loss using an advanced ECC memory that includes 4 memory modules each having 18 chips. The encoded word may be divided into four 18-bit segments. Each 18-bit segment may be stored in a separate memory module. Each bit of an 18-bit segment may be stored in a separate memory chip.

If the advanced ECC memory includes four single-ranked ×4 memory modules, 4 ranks may need to be accessed to transfer a 72-bit encoded word to or from the advanced ECC memory. If the advanced ECC memory includes four dual-ranked ×8 memory modules, 8 ranks may need to be accessed to transfer a 72-bit encoded word to or from the advanced ECC memory. Accessing multiple ranks to transfer an encoded word may impact the performance of an advanced ECC memory by increasing access latency due to a time needed to switch shared buses between the multiple ranks and a time needed to transfer data to or from one rank at a time.

Data that is to be written to an advanced ECC memory may need to be interleaved in order to write each bit of an encoded word to a different memory chip. Data that is read from an advanced ECC memory may need to be de-interleaved to reconstruct the desired encoded word that was stored on multiple memory chips. The interleaving of data that is to be written and de-interleaving of data that is read may also impact the performance of an advanced ECC memory by further increasing access latency corresponding to a time needed to perform the interleaving or de-interleaving of the data.

To transfer a 72-bit encoded word to or from an advanced ECC memory that includes four single-ranked ×4 memory modules, 288 bits (72 bits×4 modules×1 rank per module) of data may need to be transferred to or from the advanced ECC memory. To transfer a 72-bit encoded word to or from an advanced ECC memory that includes four dual-ranked ×8 memory modules, 576 bits (72 bits×4 modules×2 ranks per module) of data may need to be transferred to or from the advanced ECC memory. Generally, to read an encoded word from an advanced ECC memory, large blocks of data that include data other than a desired encoded word may also need to be transferred along with the desired encoded word. To write data to an advanced ECC memory, large blocks of data that include multiple encoded words may need to be generated and buffered before the writing of the data can be performed.

Because large blocks of data that include multiple encoded words are transferred to or from an advanced ECC memory each time a single encoded word is requested or modified, the advanced ECC memory may need to perform read-modify-write (RMW) to modify a single encoded word. For RMW, the advanced ECC memory reads a large block of data that includes the encoded word that has been modified. The advanced ECC memory may replace the bits of an encoded word in the large block of data that correspond to the bits of the modified encoded word. The large block of data with the modified encoded word is then written back to the advanced ECC memory. RMW may impact the performance of an advanced ECC memory by decreasing data throughput and increasing access latency. To write a single encoded word to an advanced ECC memory, the ECC memory needs to perform a read operation and a write operation. This may decrease a rate at which data can be written to the advanced ECC memory and increase an amount of time needed to write data to the advanced ECC memory.

SUMMARY

The present disclosure describes systems and techniques relating to ECC capability for a memory that can protect data from errors caused by the failure of up to two memory devices and multi-bit errors in a single memory chip (referred to in this disclosure as ChipRaid-ECC). In general, in one aspect, the present disclosure describes a memory controller that is configured to receive a data word to be stored in the memory, generate error checking and correcting (ECC) information for the data word, the data word and ECC information forming an encoded word, and distribute bits of the encoded word across a plurality of concurrently accessible memory devices in accordance with one or more indications specifying a number of the bits of the encoded word to store in a wordline of each of the plurality of concurrently accessible memory devices, wherein bits of the data word are to be stored in two or more memory devices of the plurality of memory devices, and bits of the ECC information are to be stored in two or more memory devices of the plurality of memory devices.

The described systems and techniques can be implemented to realize none, one, or more of the following advantages. ChipRaid-ECC capability may be provided for a non-ECC memory. Providing ChipRaid-ECC capability for a non-ECC memory may reduce the cost typically associated with a system having ECC capability because a non-ECC memory is typically less expensive and uses less power than an ECC memory. ChipRaid-ECC capability may be provided for an ECC memory that includes ECC circuitry built into the device. ChipRaid-ECC capability may be provided in addition to or as an alternative to ECC capabilities provided by an ECC memory. Providing ChipRaid-ECC capability for an ECC memory may improve performance of an ECC memory with respect to access latency and data throughput as compared to the ECC used by the ECC memory. For example, ChipRaid-ECC may distribute a data word and ECC information across memory chips in a same rank, which avoids access latency associated with advanced ECC such as access latency due to a time needed to switch shared buses between multiple ranks, a time needed to transfer data to or from one rank at a time, and a time needed to process large blocks of data. As another example, RMW operations can be avoided by generating 1 byte of ECC for every 1 byte of data and writing bytes of data and its corresponding bytes of ECC to a memory directly. ChipRaid-ECC may provide data with stronger ECC protection than advanced ECC. For example, ChipRaid-ECC may generate a 2-byte ECC segment for each 8 bytes of data, which can provide 2-bit error correction and 3-bit error detection for 8 bytes of data. Multi-bit error detection may protect data from multi-bit errors in a single memory chip. Advanced ECC memories typically do not provide ECC capability with two or more bit error correction. ChipRaid-ECC may protect data from errors caused by the failure of two memory devices by calculating two different checksums for an encoded word. Advanced ECC memories typically do not protect data from errors caused by the failure of more than one memory device, ChipRaid-ECC capability may be provided for memories with non-conventional or custom interface configurations. For example, ChipRaid-ECC may be provided for a memory having a 48-bit interface.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

Details of one or more implementations are set forth in the accompanying drawings and the description below. Other features, objects, and advantages may be apparent from the description and drawings, and from the claims.

DETAILED DESCRIPTION

Various implementations of the present disclosure are discussed below in the context of ChipRaid-ECC capability for a memory. The systems and techniques described in this disclosure are generally applicable to any memory system for which it is desirable to provide ChipRaid-ECC capability. While specific implementations of memory and memory controllers are illustrated and described, many other memory and memory controller implementations may exist that include components different than those illustrated and described below.

Figure 1:
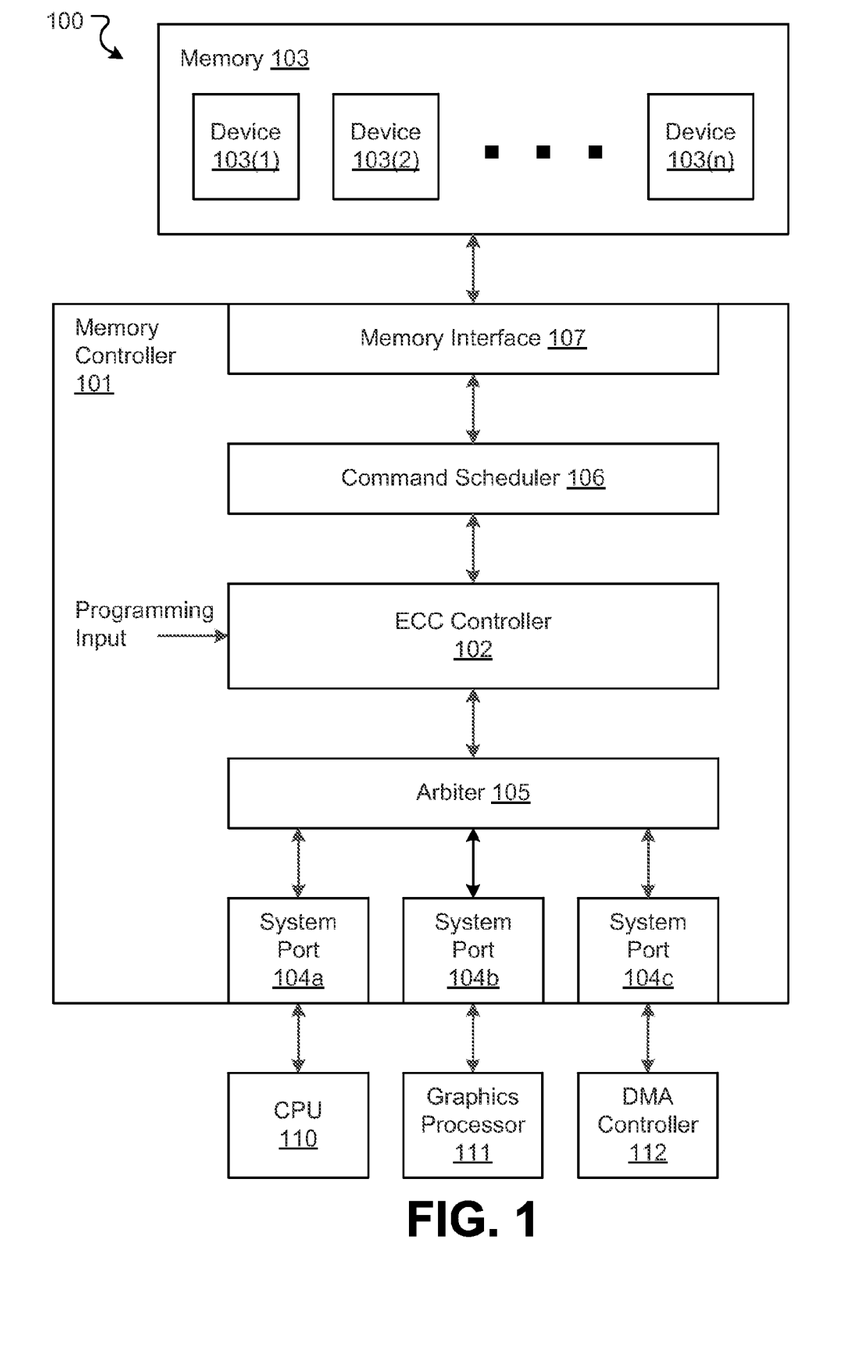
FIG. 1 is block diagram showing an example of a system in which an ECC controller may be utilized to provide ChipRaid-ECC capability for a memory.

FIG. 1 is a block diagram showing an example of a system 100 that includes a memory controller 101 in which an ECC controller 102 may be utilized to provide ChipRaid-ECC capability for a memory 103. The memory controller 101 may include multiple system ports 104a, 104b and 104c, an arbiter 105, and a command scheduler 106. The system ports 104a, 104b, 104c may connect the memory controller 101 to other components of the system 100, such as a central processing unit (CPU) 110, a graphics processor 111, and a direct memory access (DMA) controller 112. The arbiter 105 may perform arbitration of memory access requests from the system ports 104. The command scheduler 106 may schedule memory access requests from the ECC controller 102 based on various factors, such as memory bank status, access priority, and access type (e.g., read or write).

The memory controller 101 includes a memory interface 107 that connects the memory controller 101 to the memory 103. The memory interface 107 may be configured to connect with a non-ECC memory, an ECC memory, or a non-conventional or custom memory. In some implementations, the memory interface 107 may be 32 bits or 64 bits wide to connect with a non-ECC memory. In some implementations, the memory interface 107 may be 40 bits or 72 bits wide to connect with an ECC memory. In some implementations, the memory interface 107 may be 48 bits wide to connect with a custom memory that provides 48 bits at a time. In some implementations, the memory interface 107 may be 80 bits wide to connect with a custom memory that provides 64 bits of data, 8 bits of ECC, and 8 bits of checksum.

The memory 103 may include any memory system for which it is desirable to provide ChipRaid-ECC capability. In some implementations, the memory 103 may include a volatile memory, such as random-access memory (RAM), including a dynamic random-access memory (DRAM), a static random-access memory (SRAM), a double data rate random-access memory (DDR RAM), or other similar devices. In some implementations, the memory 103 may include a non-volatile memory, such as a flash memory or other similar persistent storage devices. The memory controller 101 and the memory 103 can be included in an integrated circuit device, such as a system on chip (SoC) device.

The memory 103 may be a non-ECC memory or an ECC memory. A non-ECC memory is an integrated circuit device without ECC circuitry built into the device, whereas an ECC memory is an integrated circuit device with ECC circuitry built into the device. ECC circuitry built into an ECC memory may include an ECC controller, an additional memory chip, and a wider interface. Even though an ECC memory may include an additional memory chip and a wider interface, a non-ECC memory and an ECC memory can provide the same data throughput.

The memory 103 includes multiple memory devices 103(1), 103(2) to 103(n). Examples of such memory devices include modules, chips, or disks. The memory 103 includes one or more independent sets of memory devices connected to the same address and data buses. Each independent set of memory devices is referred to as a rank. Only one rank of the memory 103 may be accessed at a time.

In some implementations, the memory devices 103(1), 103(2) to 103(n) may be ×4 memory devices. Each ×4 memory device has a data width of 4 bits. A set of eight ×4 memory devices may form a rank to provide access to 32 bits of data at a time. A set of sixteen ×4 memory devices may form a rank to provide access to 64 bits of data at a time. A set of eighteen ×4 memory devices may form a rank to provide access to 72 bits of data at a time.

In some implementations, the memory devices 103(1), 103(2) to 103(n) may be ×8 memory devices. Each ×8 memory device has a data width of 8 bits. A set of four ×8 memory devices may form a rank to provide access to 32 bits of data at a time. A set of five ×8 memory devices may form a rank to provide access to 40 bits of data at a time. A set of six ×8 memory devices may form a rank to provide access to 48 bits of data at a time. A set of eight ×8 memory devices may form a rank to provide access to 64 bits of data at a time, A set of nine ×8 memory devices may form a rank to provide access to 72 bits of data at a time.

The ECC controller 102 provides ChipRaid-ECC capability for the memory 103. The ECC controller 102 may receive a programming input that the ECC controller 102 uses to provide Chip-Raid ECC capability. In some implementations, the programming input may be values specified by software or firmware executed by the memory controller 101 or the ECC controller 102. In some implementations, the programming input may be received from an external source, e.g., a user of the system 100, while the ECC controller 102 is processing data.

Figure 2:
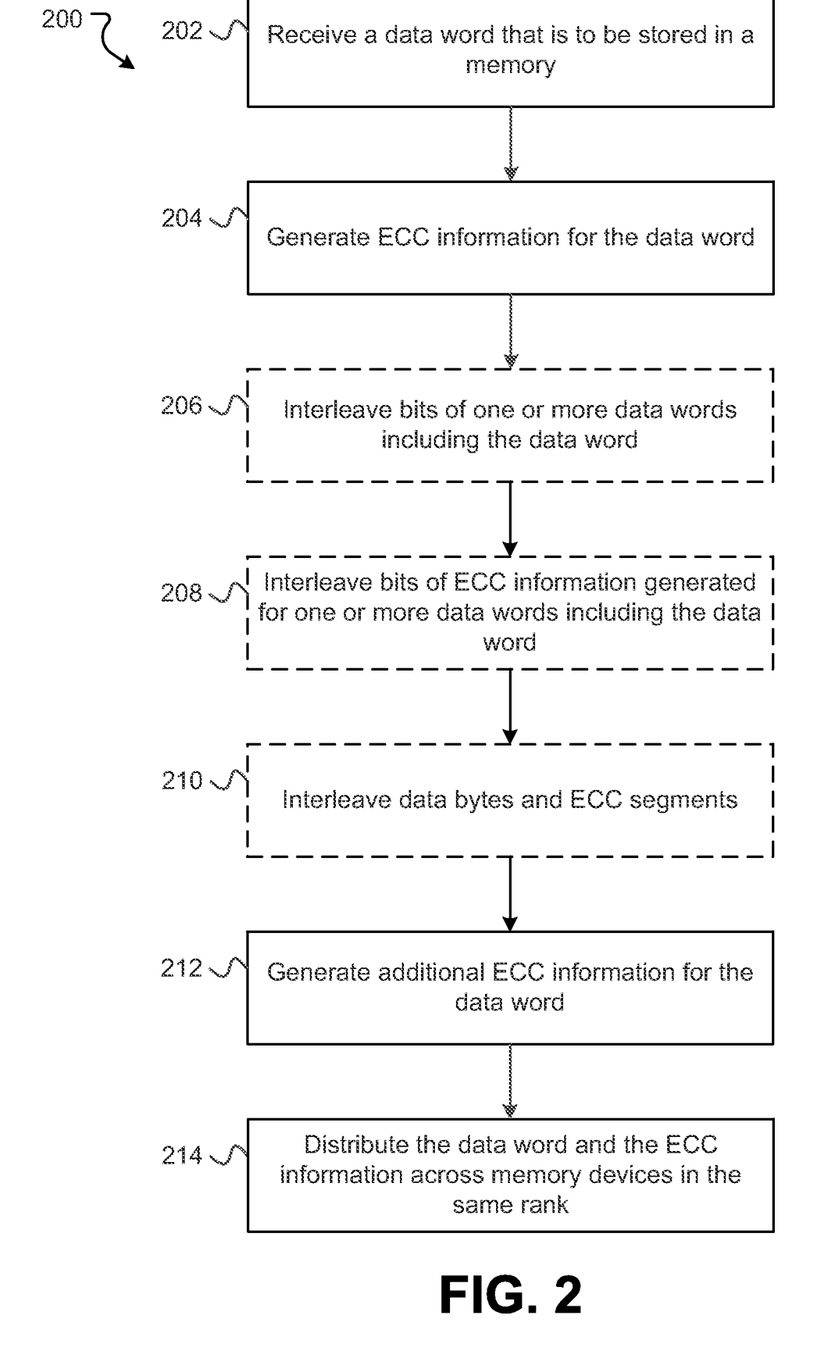
FIG. 2 is a flowchart showing examples of operations performed by an ECC controller to process a data word using ChipRaid-ECC.

FIG. 2 is a flowchart showing examples of operations 200 performed by an ECC controller, e.g., the ECC controller 102 of FIG. 1, to process a data word that is to be stored in a memory using ChipRaid-ECC. At 202, the ECC controller receives the data word that is to be stored in a memory such as memory 103 of FIG. 1. A data word as used in this disclosure is the largest unit of data, not including ECC information, that can be transferred to and from the memory in a single operation. For example, a data word may include 32 bits or 64 bits of data received from a. system component, e.g., CPU 110, graphics processor 111, or DMA controller 112 of FIG. 1.

At 204, the ECC controller generates one or more bits of ECC information for the data word. The ECC information may include ECC bits that can be used to detect and correct bit errors in the data word. The ECC controller may generate a set of ECC bits (referred to ECC segments) for each data block (e.g., 1 byte of data, 4 bytes of data, 8 bytes of data, 16 bytes of data, or other numbers of bytes of data) of the data word. The data block size and ECC segment size may be variable based on, for example, factors that affect integrity of a data signal. Factors that affect the integrity of the data signal may include data rate, clock frequency, temperature, or power consumption level at which the memory is operating. Other factors that affect the integrity of the data signal may include external radiation and noise. The data block size and the ECC segment size may be programmable and may be based on the programming input to the ECC controller. The programming input may specify, for example, a number of ECC bits to generate for the data word, the data block size, or the ECC segment size.

The ECC controller 102 may use any suitable ECC algorithm to generate the ECC segments for each data block of the data word, such as enhanced Hamming code, SEC-DED, or Bose-Chaudhuri-Hocquenghem (BCH) code. Using enhanced Hamming code or SEC-DED to protect a data block may provide the data block with 1-bit error correction and 2-bit error detection. Using BCH code to protect a data block may provide the data block with 2-bit error correction.

For example, the ECC controller may generate a 6-bit ECC segment for a 1-byte block of data using enhanced Hamming code, which provides 1-bit error correction and 2-bit error detection for the 1 byte of data. As another example, the ECC controller may generate a 8-bit ECC segment for 1-byte block of data using BCH code, which provides 2-bit error correction and 2-bit error detection for the 1 byte of data. As yet another example, the ECC controller may generate a 2-byte ECC segment for an 8-byte block of data, which provides 2-bit error correction and 3-bit error detection for 8 bytes of data. Other data block sizes and ECC segment sizes are possible. In general, the ability to correct errors in a data word is dependent upon which ECC algorithm is used to generate the ECC segments and how many bits are in an ECC segment.

RMW can be avoided using ChipRaid-ECC to protect data written to a memory when only a portion of the data word is being modified. RMW can be avoided by generating a 1-byte ECC segment for a 1-byte block of data, which provides 1-bit error correction and 2-bit error detection for the 1 byte of data. When a portion of an encoded word is modified, the ECC controller can write the modified bytes of data and the corresponding modified bytes of ECC information to the memory directly without performing RMW operations because 1 byte of data corresponds to 1 byte of ECC information. To write the bytes of data and the bytes of the ECC information, the ECC controller can use a data mask, or write strobe, to indicate the bytes of the encoded word that are to be updated and the bytes of the encoded word that are not to be updated.

At 206, the ECC controller may optionally interleave bits of one or more data words including the data word, which may create a more uniform distribution of errors. In some implementations, the ECC controller may interleave bits of a first portion of the data word and bits of a second portion of the data word and distribute the interleaved data word across two encoded words. For example, the ECC controller may interleave every bit of the first portion and the second portion of the data word. The ECC controller may distribute the interleaved data word across two encoded words. As another example, the ECC controller may interleave every other bit of the first portion and the second portion of the data word to form the two encoded words. The first encoded word includes odd bits of the first portion of the data word and odd bits of the second portion of the data word. The second encoded word includes even bits of the first portion of the data word and even bits of the second portion of the data word.

In some implementations, the ECC controller may interleave bits of the data word and bits of one or more other data words and distribute the interleaved data words across two or more encoded words in a similar fashion as described above for interleaving portions of the data word. For example, the ECC controller may interleave the data word and one other data word and distribute the interleaved data words across two encoded words. The ECC controller may interleave the data word and three other data words and distribute the interleaved data words across four encoded words. The ECC controller may interleave the data word and seven other data words and distribute the interleaved data words across eight encoded words. Interleaving multiple data words provides the capability to correct multi-bit errors in a wordline of the memory that are associated with different data words. A wordline as used in this disclosure refers to a row of a memory device. The number of data words to interleave may be programmable and may be based on the programming input to the ECC controller. The programming input may specify, for example, the number of data words to interleave, the number of multi-bit errors to provide protection against, or the number of bits of a data word to store in a wordline of a memory device.

At 208, the ECC controller may optionally interleave bits of ECC information generated for one or more data words, including the ECC information generated for the data word. In some implementations, the ECC controller may interleave bits of a first portion of the ECC information and bits of a second portion of the ECC information and distribute the interleaved ECC information across two encoded words. For example, the ECC controller may interleave every bit of the first portion and the second portion of the ECC information. The ECC controller may distribute the interleaved ECC information across two encoded words. As another example, the ECC controller may interleave every other bit of the first portion and the second portion of the ECC information to form two encoded words. The first encoded word includes odd bits of the first portion of the ECC information and odd bits of the second portion of the ECC information. The second encoded word includes even bits of the first portion of the ECC information and even bits of the second portion of the ECC information.

In some implementations, the ECC controller may interleave bits of the ECC information and bits of ECC information generated for one or more other data words and distribute the interleaved ECC information across two or more encoded words in a similar fashion as described above for interleaving multiple data words. The number of ECC words to interleave corresponds to the number of data words to interleave, which may be programmable and may be based on the programming input to the ECC controller, as described above.

Figure 3:
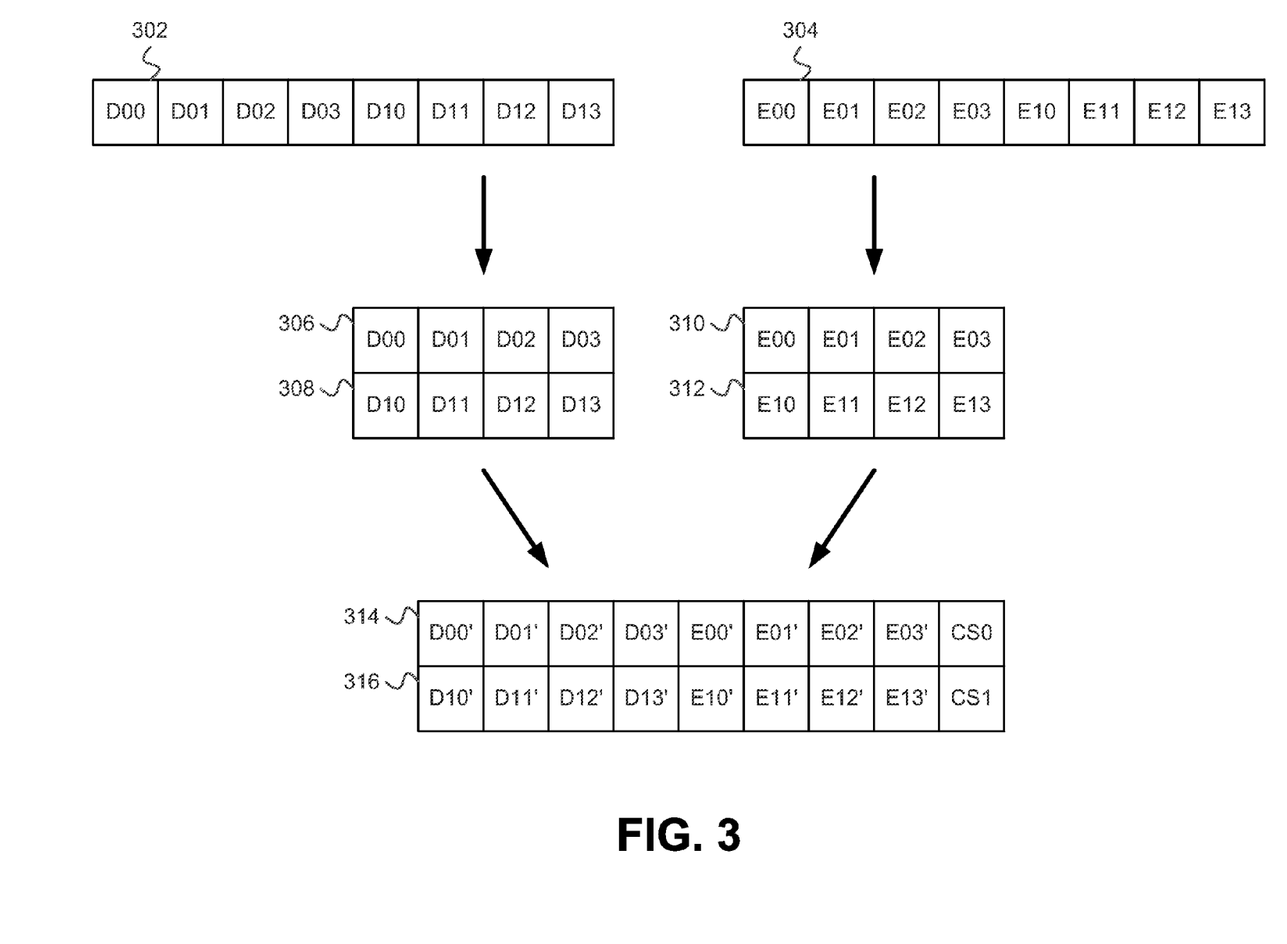
FIG. 3 shows an example of data formats of encoded words that include interleaved data and interleaved ECC information.

FIG. 3 shows an example of data formats of encoded words that include interleaved data and interleaved ECC information. The ECC controller receives a data word 302. The data word 302 may be a 64-bit data word (the bytes are referenced in FIG. 3 using base 4 numbers). The ECC controller generates ECC information 304 for the data word 302. The ECC controller may generate 6 bits of the ECC information 304 for each byte of the data word 302 to generate 48 bits of ECC information.

The ECC controller interleaves a first portion 306 of the data word and a second portion 308 of the data word. For example, the ECC controller may interleave bytes D00 and D10 as follows: D00'[7:0]={D10[6], D00[6], D10[4], D00[4], D10[2], D00[2], D10[0], D00[0]} and D10'[7:0]={D10[7], D00[7], D10[5], D00[5], D10[3], D00[3], D10[1], D00[1]}. The ECC controller may interleave bytes D01, D11, D02, D12, D03, D13 in a similar fashion to generate D01', D11', D02', D12', D03', D13'. In this implementation, the odd bits of the first portion 306 and the odd bits of the second portion 308 are interleaved, and the even bits of the first portion 306 and the even bits of the second portion 308 are interleaved.

The ECC controller interleaves a first portion 310 of the ECC information and a second portion 312 of the ECC information. For example, the ECC controller may interleave the 6 bits of ECC information E00 and the 6 bits of ECC information E10 as follows: E00''[5:0]={E10[4], E00[4], E10[2], E00[2], E10[0], E00[0]} and E10'[5:0]={E10[5], E00[5], E10[3], E00[3], E10[1], E00[1]}. The ECC controller may interleave E01, E11, E02, E12, E03, E13 in a similar fashion to generate E01', E11', E02', E12', E03', E13'. In this implementation, the odd bits of the first portion 310 and the odd bits of the second portion 312 are interleaved, and the even bits of the first portion 310 and the even bits of the second portion 312 are interleaved.

The ECC controller forms two 64-bit encoded words 314 and 316. Encoded word 314 includes a first portion of the interleaved data word and a first portion of the interleaved ECC information. Encoded word 316 includes a second portion of the interleaved data word and a second portion of the interleaved ECC information. The two encoded words 314 and 316 may each include a 1-byte checksum CS0 and CS1, which will be described in more detail later in this disclosure.

Interleaving the data word and ECC information distributing the interleaved data word and ECC information across two encoded words may provide protection for some multi-bit error situations. For example, the encoded word 314 may have 2 bits that are in error. The error may have occurred when the encoded word 314 was being read from a memory, and bits D00'[0] and D00'[1] became flipped while being read. The 2-bit error in the encoded word 314 may not be correctable without de-interleaving the encoded word. Since bit D00'[0] corresponds to bit D00[0] of the first portion 306 and bit D00'[1] corresponds to bit D10[0] of the second portion 308, the encoded word 314 is de-interleaved to generate the first portion 306 and the second portion 308. The first portion 306 has 1 bit that is in error, and the second portion 308 has 1 bit that is in error. The single bit errors in each of the first portion 306 and the second portion 308 can now be corrected.

Returning to FIG. 2 at 210, the ECC controller may optionally interleave data blocks of the data word and ECC segments of the ECC information for storage in the memory. For example, an encoded word may be arranged such that a 1-byte data block is followed by its corresponding 6-bit ECC segment. As another example, an encoded word may be arranged such that a 1-byte data block is followed by its corresponding 1-byte ECC segment. As yet another example, an encoded word may be arranged such that an 8-byte data block is followed by its corresponding 2-byte ECC segment. Data blocks and ECC segments having sizes other than those described above may be interleaved. When 1 byte of data is interleaved with 1 byte of ECC information and a portion of the encoded word is modified, the ECC controller can write the modified bytes of data and the corresponding modified bytes of ECC information to the memory directly without performing RMW operations. To write the bytes of data and the bytes of the ECC information, the ECC controller can use a data mask, or write strobe, to indicate the bytes of the encoded word that are to be updated and the bytes of the encoded word that are not to be updated.

At 212, the ECC controller generates one or more bytes of additional ECC information. The additional ECC information may include checksum bits or parity bits that can be used to detect and correct errors in the encoded word. The ECC controller 102 may use any suitable algorithm to generate checksum bits, such as RAID 5 or RAID 6. Using RAID 5, the ECC controller may generate checksum bits for an encoded word by computing an XOR across all data bytes and ECC bytes of an encoded word. Using RAID 5 to generate checksum bits protects data from errors caused by the failure of one memory device. Using RAID 6, the ECC controller may generate two different sets of checksum bits for an encoded word. The first set of checksum bits is generated by computing an XOR across all data bytes and ECC bytes of the encoded word, as in RAID 5. The second set of checksum bits is generated by computing an XOR across shifted versions of the data bytes and shifted versions of the ECC bytes of the encoded word. Using RAID 6 to generate two different sets of checksum bits protects data from errors caused by the failure of two memory devices.

In the example of FIG. 3, the ECC controller generates a 1-byte checksum CS0 for the encoded word 314 and a 1-byte checksum CS1 for the encoded word 316. To generate each checksum, the ECC controller computes an XOR across all data bytes and ECC bytes of the corresponding encoded word. For example, CS0 is computed as follows: CS0=D00' [7:0] XOR D01'[7:0] XOR D02'[7:0] XOR D03'[7:0] XOR E0'[24:16] XOR E0'[15:8] XOR E0'[7:0] where E0'[24:0] ={E03'[5:0], E02'[5:0], E01'[5:0], E00'[5:0]}. The ECC controller computes CS1 for encoded word 316 in a similar fashion.

Returning to FIG. 2 at 214, the ECC controller distributes the encoded word and the one or more checksums across memory devices in the same rank. The ECC controller may distribute the bits of the encoded word across the memory devices such that each memory device stores more than one bit of the data word, the ECC information, or both the data word and the ECC information. The ECC controller may distribute the bits of the data word across two or more memory devices and the bits of ECC information across two or more other memory devices. The ECC controller may distribute the bits of the encoded word across the memory devices in accordance with the programming input to the ECC controller. The programming input may specify the number of bits of the encoded word to store in a wordline of each memory device. The ECC controller may determine how to distribute the data word and the ECC information across memory devices based on a length of the data word, a length of the ECC information, a length of the encoded word, an interface width of the memory, a width of each memory device of the memory, and a number of memory devices in a rank.

In some implementations, the ECC controller distributes the bits of the data word across a first set of the memory devices that are designated for storing only data bits and distributes the bits of the ECC information across a second, different set of memory devices that are designated for storing only ECC information. In some implementations, the ECC controller distributes the bits of the data word and the ECC information such that one or more memory devices store only checksum bits, and the remaining memory devices store both data bits and ECC bits. For a memory device that stores both data bits and ECC bits, the data bits and ECC bits are stored in separate locations of the memory device. In some implementations, the data bits and ECC bits may be stored in different banks of the memory device. In some implementations, the data bits and ECC bits may be stored in the same wordline of the memory device, but in different sections of the wordline.

Figure 4:
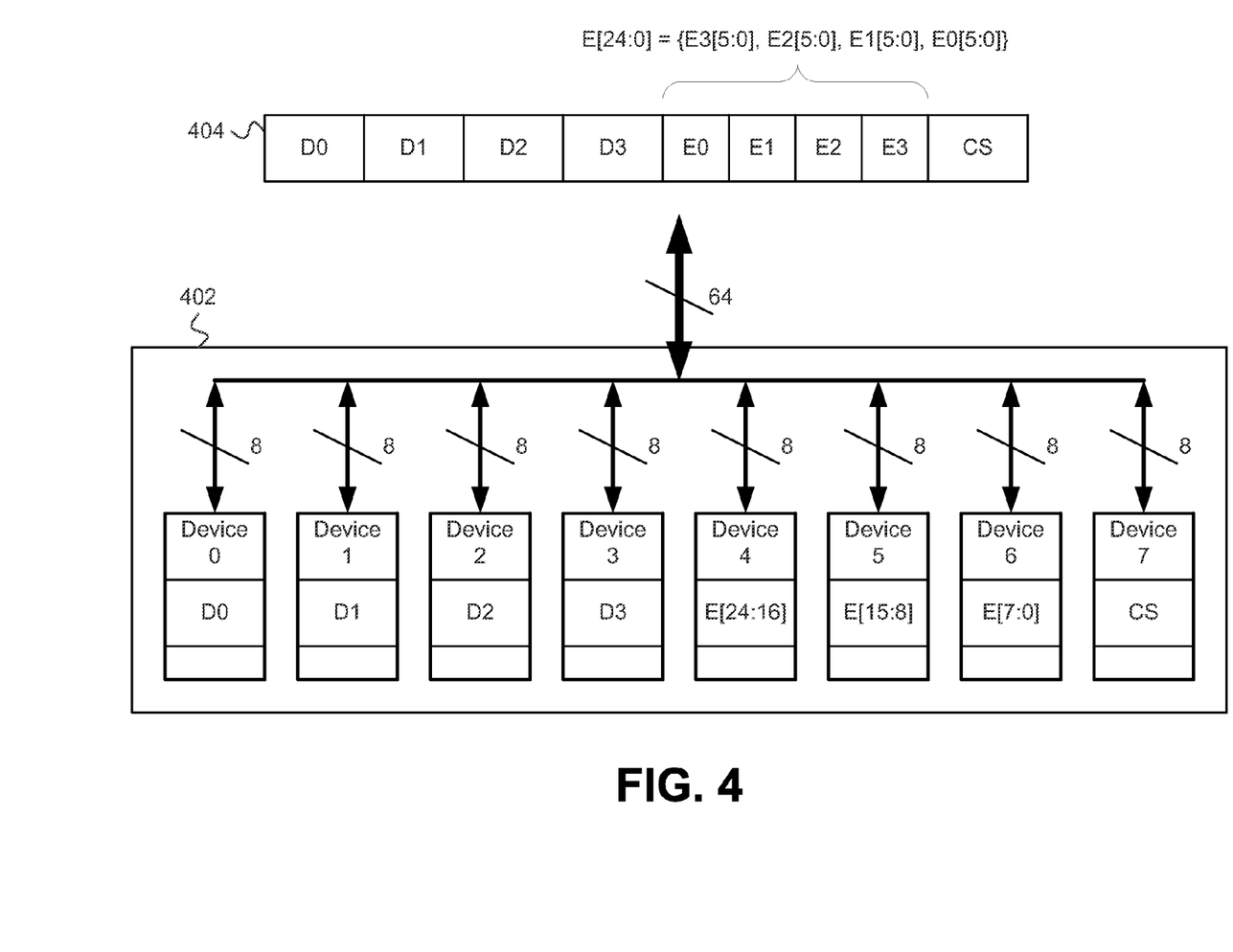
FIGS. 4-7 show examples of memories that include memory devices that are designated for storing only data or only ECC information

FIGS. 4-7 show examples of memories that include memory devices that are designated for storing only data bits or only ECC information. FIG. 4 shows an example of a 64-bit memory 402 that includes eight ×8 memory devices, e.g., Device 0, Device 1, Device 2, Device 3, Device 4, Device 5, Device 6, and Device 7, that are in the same rank. Each of the memory devices provides access to 8 bits at a time. The set of eight memory devices provides access to 64 bits at a time.

The encoded word 404 includes a 32-bit data word, 24 ECC bits, and an 8-bit checksum. Each 6 bits of the 24 ECC bits correspond to a byte of the data word, e.g., E0[0:5] corresponds to D0[7:0]. The encoded word 404 is distributed across the eight memory devices such that each memory device stores only data bits or only ECC information. Each memory device stores a byte of either the data word or the ECC information. For example, byte D0 is stored in Device 0, byte D1 is stored in Device 1, byte D2 is stored in Device 2, byte D3 is stored in Device 3, a first byte of ECC information E[24:16] is stored in Device 4, a second byte of ECC information E[15:8] is stored in Device 5, a third byte of ECC information E[7:0] is stored in Device 6, and a checksum CS is stored in Device 7. The ECC information E[24:0] includes the 6-bit ECC segments E0, E1, E2, E3 such that E[24:0]={E3 [5:0], E2[5:0], E1[5:0], E0[5:0]}.

Figure 5:
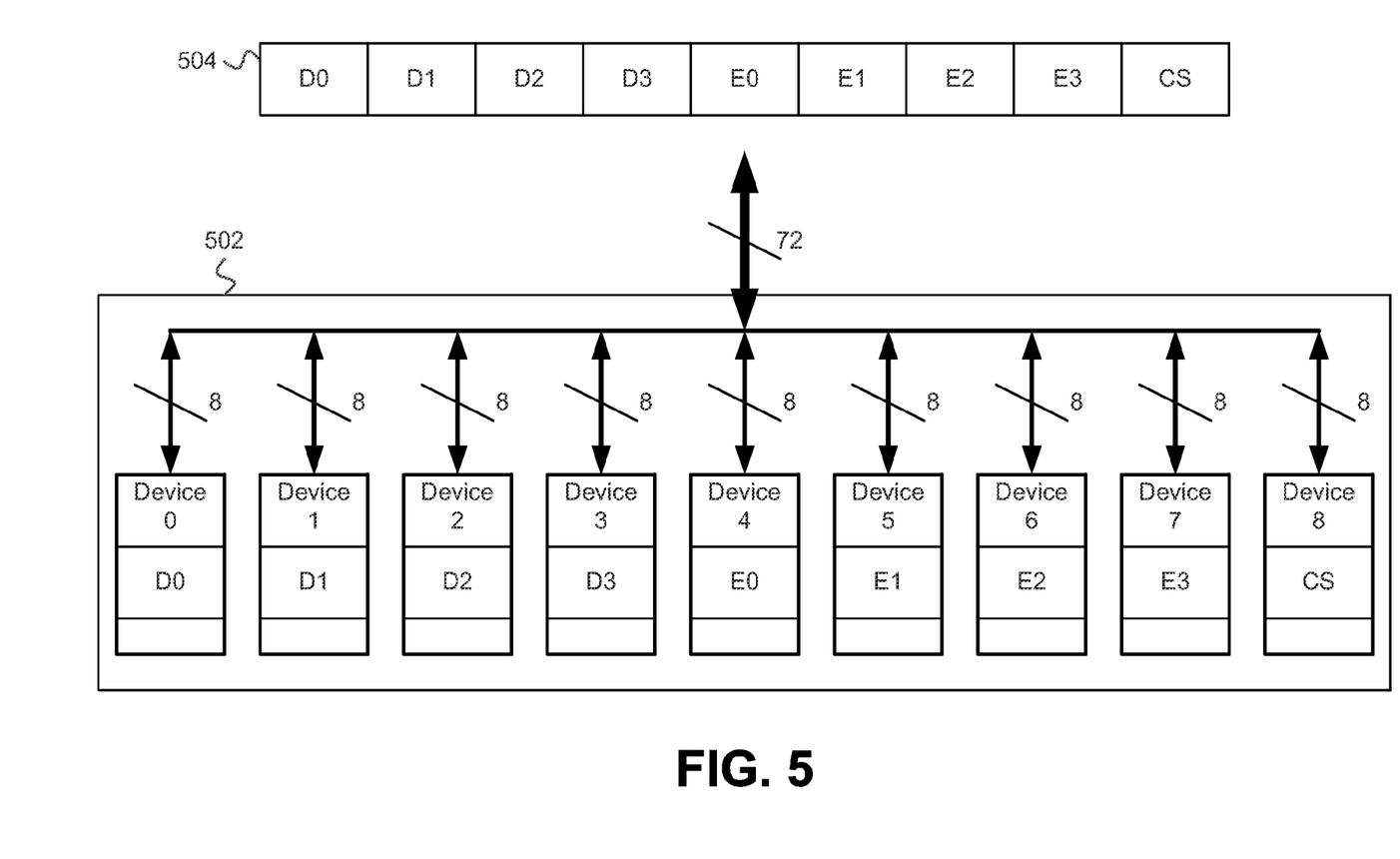
Figure 6:
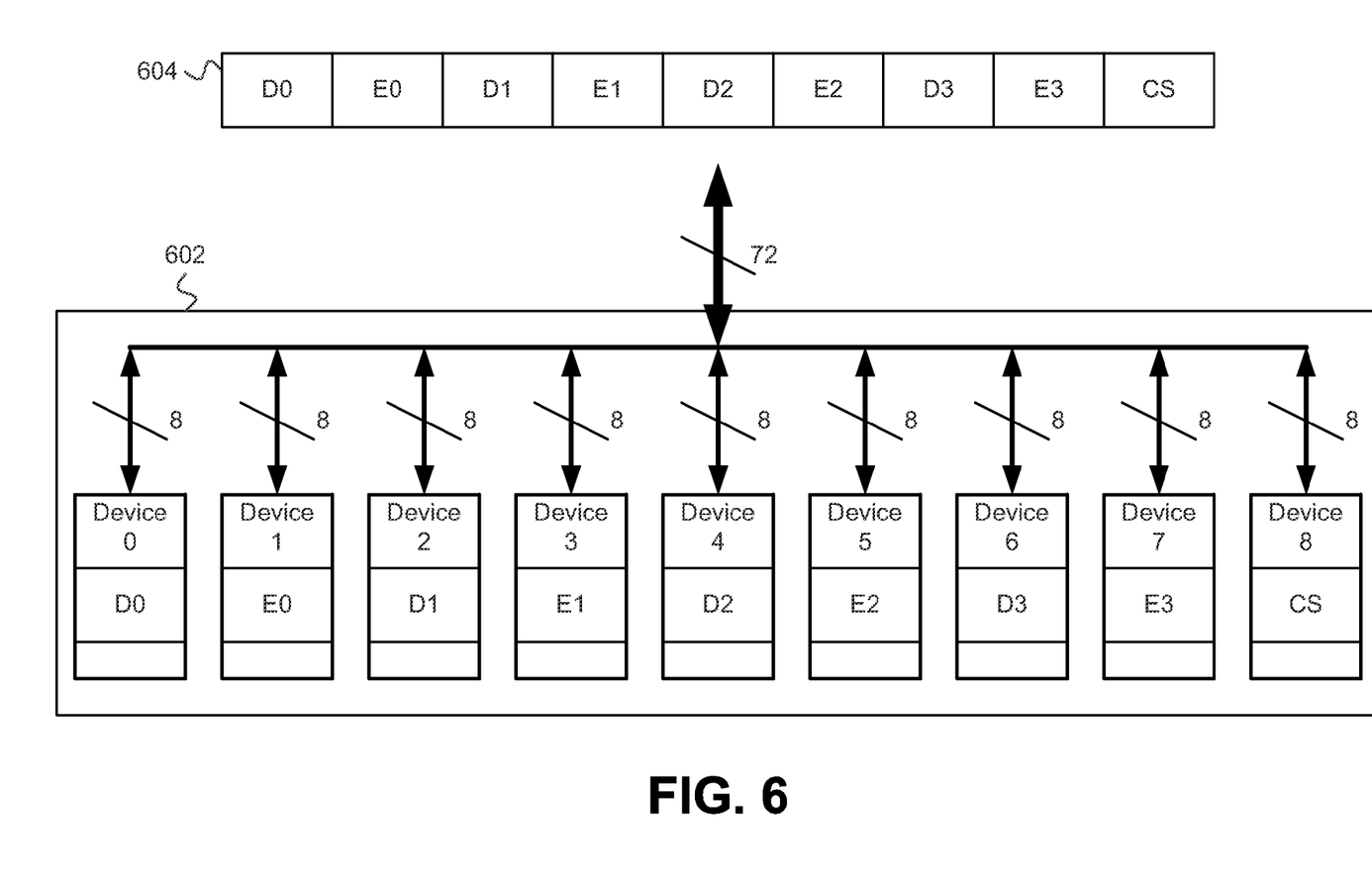

FIGS. 5 and 6 show examples of 72-bit memories 502, 602 that include nine ×8 memory devices, e.g., Device 0, Device 1, Device 2, Device 3, Device 4, Device 5, Device 6, Device 7, and Device 8, that are in the same rank. Each of the memory devices provides access to 8 bits at a time. The set of nine memory devices provides access to 72 bits at a time.

In FIGS. 5 and 6, each of the encoded words 504, 604 includes a 32-bit data word, 32 ECC bits, and an 8-bit checksum. Each byte of the 32 bits of ECC information corresponds to a byte of the data word, e.g., E0[7:0] corresponds to D0[7:0]. Each of the encoded words 504, 604 are distributed across nine memory devices such that each memory device stores only data bits or only ECC information.

In the examples of FIG. 5 and FIG. 6, RMW can be avoided when only a portion of the data word is being modified because 1 byte of data corresponds to 1 byte of ECC information. When a portion of an encoded word is modified, the ECC controller can write the modified bytes of data and the corresponding modified bytes of ECC information to the memory directly without performing RMW operations. To write the bytes of data and the bytes of the ECC information, the ECC controller can use a data mask, or write strobe, to indicate the bytes of the encoded word that are to be updated and the bytes of the encoded word that are not to be updated.

In the example of FIG. 5, the encoded word 504 is distributed across the nine memory devices so that byte D0 is stored in Device 0, byte D1 is stored in Device 1, byte D2 is stored in Device 2, byte D3 is stored in Device 3, byte E0 is stored in Device 4, byte E1 is stored in Device 5, byte E2 is stored in Device 6, byte E3 is stored in Device 7, and a checksum CS is stored in Device 8.

In the example of FIG. 6, the encoded word 604 is formed by interleaving the data bytes and the ECC byes. In other words, the encoded word 604 is arranged in a format where each byte of the data word is followed by its corresponding ECC byte. The encoded word 604 is distributed across the nine memory devices so that that byte D0 is stored in Device 0, byte E0 is stored in Device 1, byte D1 is stored in Device 2, byte E1 is stored in Device 3, byte D2 is stored in Device 4, byte E2 is stored in Device 5, byte D3 is stored in Device 6, byte E3 is stored in Device 7, and a checksum CS is stored in Device 8.

Figure 7:
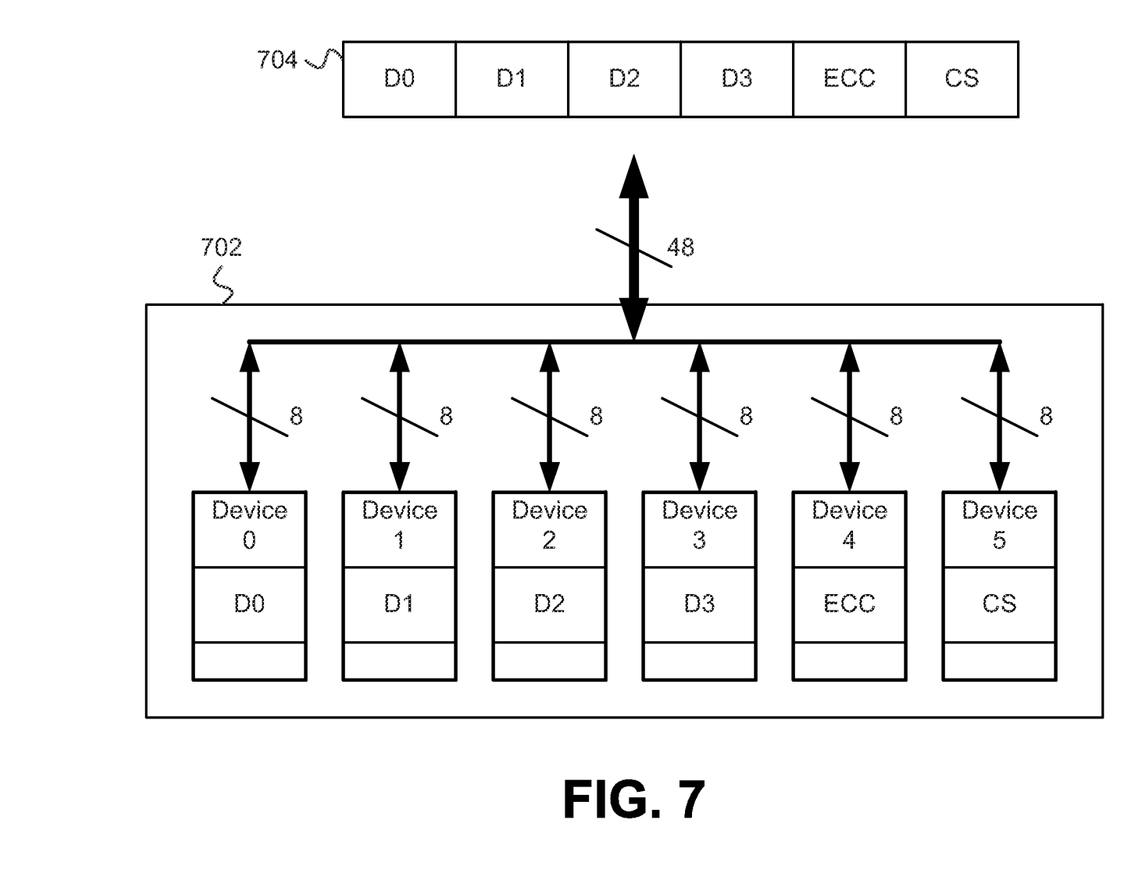

FIG. 7 shows an example of a 48-bit memory 702 that includes six ×8 memory devices, e.g., Device 0, Device 1, Device 2, Device 3, Device 4, and Device 5, that are in the same rank. Each of the memory devices provides access to 8 bits at a time. The set of six memory devices provides access to 48 bits at a time.

The encoded word 704 includes a 32-bit data word, 8 ECC bits, and an 8-bit checksum. The 8 ECC bits are generated for the entire 32-bit data word. The encoded word 704 is distributed across the eight memory devices such that each memory device stores only data bits or only ECC information. Each memory device stores a byte of either the data word or the ECC information. For example, byte D0 is stored in Device 0, byte D1 is stored in Device 1, byte D2 is stored in Device 2, byte D3 is stored in Device 3, byte ECC is stored in Device 4, and a checksum CS is stored in Device 5. The checksum CS protects the data word from errors caused by the failure of any one of the six memory devices.

Figure 8:
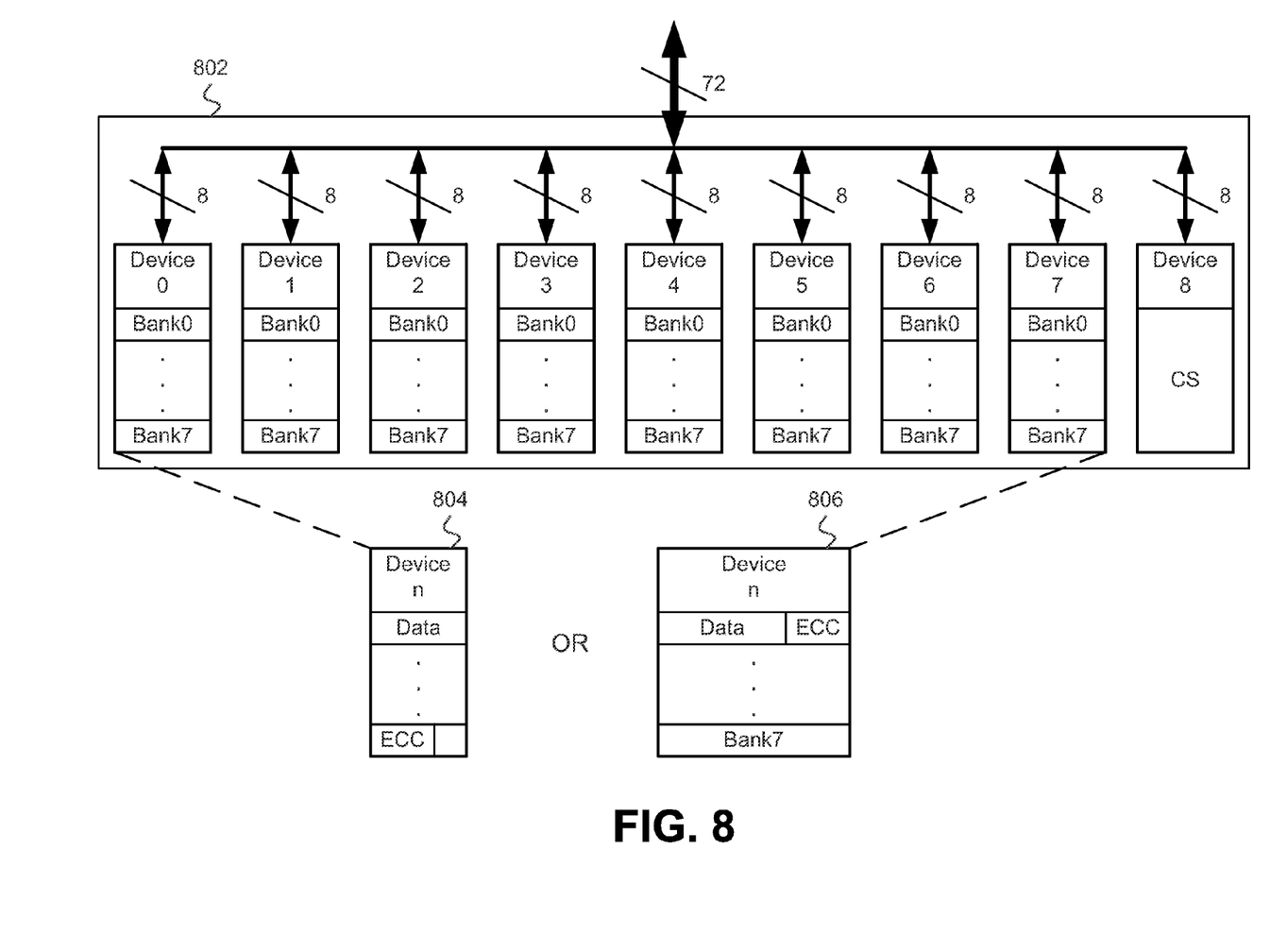
FIGS. 8 and 9 show examples of memories that include one or more memory devices that are designated for storing only ECC information and remaining memory devices that are designated for storing both data and ECC information.
Figure 9:
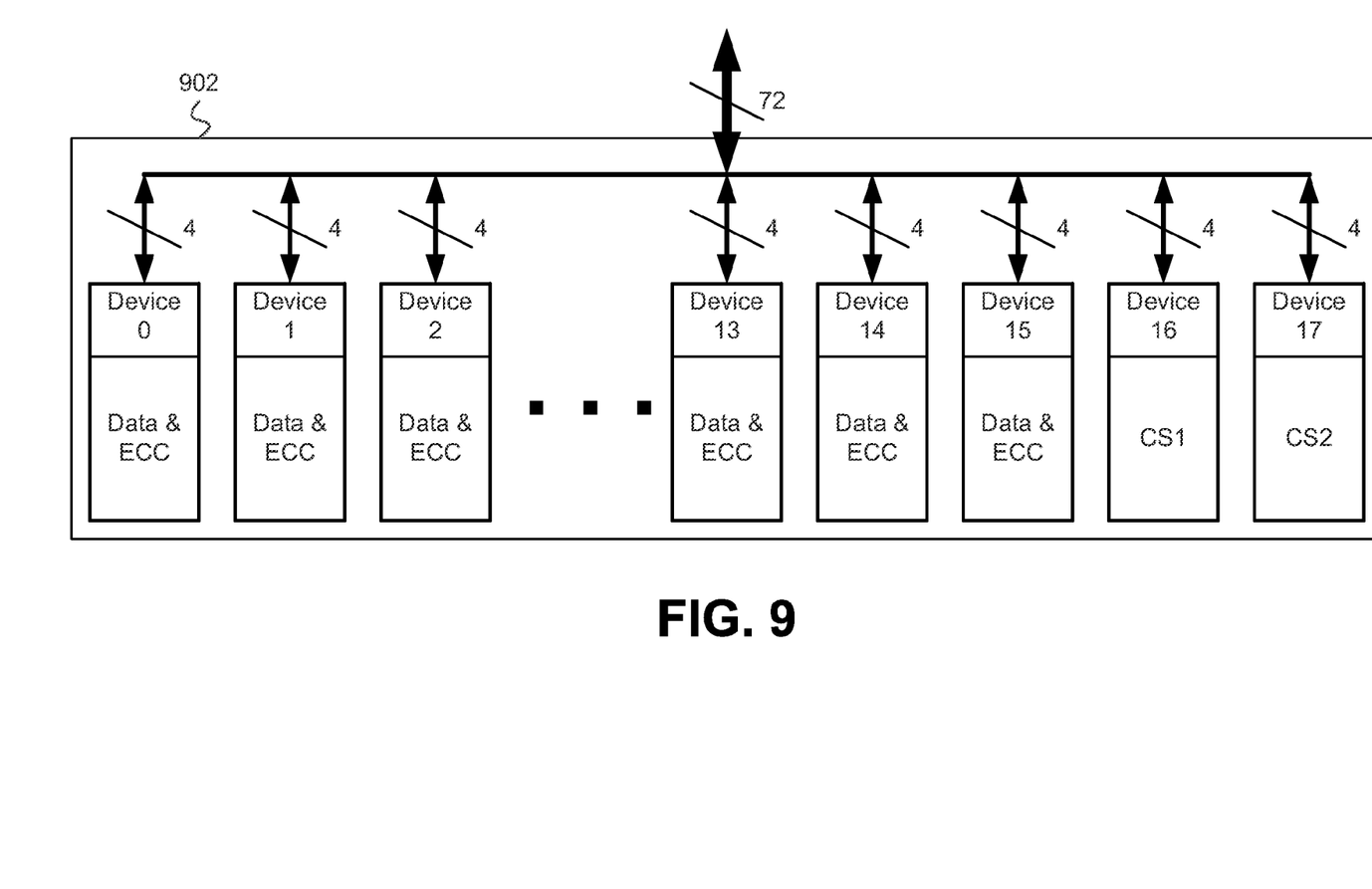

FIGS. 8 and 9 show examples of memories that store checksum bits in one or more memory devices and both data bits and ECC bits in each of the remaining memory devices. FIG. 8 shows an example of a 72-bit memory 802 that includes nine ×8 memory devices, e.g., Device 0, Device 1, Device 2, Device 3, Device 4, Device 5, Device 6, Device 7, and Device 8, that are in the same rank. Each of the nine memory devices has multiple banks, e.g., Bank0 to Bank7. Each of the memory devices provides access to 8 bits at a time. The set of nine memory devices provides access to 72 bits at a time. Device 0 through Device 7 are designated for storing both data bits and ECC bits. Device 8 is designated for storing checksum bits CS.

Each memory device that stores both data bits and ECC bits may store the bits as shown in either device 804 or device 806. In device 804, the data bits and ECC bits are stored in different banks of the memory device. In device 806, the data bits and ECC bits are stored in the same wordline, but in different sections of the wordline. The ratio of data bits to ECC bits is based on the ECC algorithm used to generate the ECC bits. For example, the ratio may be 8 bytes of data to 1 byte of ECC, 8 bytes of data to 2 bytes of ECC, 4 bytes of data to 1 byte of ECC, and other ratios of data to ECC. The data and the ECC may each be distributed evenly across the eight memory devices that are designated for storing both data and ECC bits. Other implementations for distributing the bits across memory devices that are designated for storing both data and ECC bits are possible.

FIG. 9 shows an example of a 72-bit memory 902 that includes eighteen ×4 memory devices, e.g., Device 0 through Device 17, that are in the same rank. Each of the memory devices provides access to 4 bits at a time. The set of 18 memory devices provides access to 72 bits at a time. Device 0 through Device 15 are designated for storing both data bits and ECC bits. Device 16 is designated for storing a first checksum CS1 corresponding to each encoded word. Device 17 is designated for storing a second checksum CS2 corresponding to each encoded word. Any suitable algorithm, such RAID 6, may be used to generate the checksums CS1 and CS2. Using RAID 6 to generate the two different checksums CS1 and CS2 protects data from errors caused by the failure of any two of the memory devices in the memory 902.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof including system on chip (SoC) implementations.

While this specification contains many specifics, these should not be construed as limitations on the scope of what may be claimed, but rather as descriptions of features that may be specific to particular embodiments. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations. Other implementations fall within the scope of the following claims.

What is claimed is:

1. An apparatus, comprising:
a memory interface configured to communicate with a memory, the memory including a plurality of concurrently accessible memory devices; and
a controller coupled with the memory interface, the controller configured to:
receive a data word to be stored in the memory,
generate error checking and correcting (ECC) information for the data word, the data word and ECC information forming an encoded word, and
distribute bits of the encoded word across the plurality of concurrently accessible memory devices in accordance with one or more indications specifying a number of the bits of the encoded word to store in a wordline of each of the plurality of concurrently accessible memory devices, wherein bits of the data word are to be stored in two or more memory devices of the plurality of memory devices, and bits of the ECC information are to be stored in two or more memory devices of the plurality of memory devices,
wherein the controller is configured to determine a distribution of the bits of the encoded word across the plurality of concurrently accessible memory devices and identify the two or more memory devices of the plurality of memory devices in which the bits of the data word are to be stored and the two or more memory devices of the plurality of memory devices in which the bits of the ECC information are to be stored.

2. The apparatus of claim 1, wherein the one or more indications specify a number of the bits of the ECC information to generate for the data word, and the controller is configured to generate the ECC information in accordance with the one or more indications specifying the number of the bits of the ECC information to generate for the data word.

3. The apparatus of claim 1, wherein the ECC information includes information that protects the encoded word from errors caused by a failure of two memory devices of the plurality of memory devices.

4. The apparatus of claim 1, wherein the controller is configured to interleave the ECC information and the data word.

5. The apparatus of claim 1, wherein the controller is configured to:
distribute the bits of the data word across a first set of memory devices of the plurality of concurrently accessible memory devices, the first set of memory devices including the two or more memory devices of the plurality of memory devices in which the bits of the data word are to be stored and being designated for storing only data bits; and
distribute the bits of the ECC information across a second, different set of memory devices of the plurality of concurrently accessible memory devices, the second set of memory devices including the two or more memory devices of the plurality of memory devices in which the bits of the ECC information are to be stored and being designated for storing only ECC bits.

6. The apparatus of claim 1, wherein the controller is configured to distribute the bits of the encoded word such that one or more memory devices of the plurality of concurrently accessible memory devices store both a portion of the data word and a portion of the ECC information.

7. The apparatus of claim 1, wherein the controller is configured to:
interleave the data word and one or more other data words based on the one or more indications specifying the number of the bits of the encoded word to store in the wordline of each of the plurality of concurrently accessible memory devices; and
interleave the ECC information and one or more other ECC information based on the one or more indications specifying the number of the bits of the encoded word to store in the wordline of each of the plurality of concurrently accessible memory devices.

8. The apparatus of claim 1, wherein the controller is configured to determine the distribution of the bits of the encoded word across the plurality of concurrently accessible memory devices and identify the two or more memory devices of the plurality of memory devices in which the bits of the data word are to be stored and the two or more memory devices of the plurality of memory devices in which the bits of the ECC information are to be stored in response to a programming input to the controller.

9. A system, comprising:
a memory that includes a plurality of concurrently accessible memory devices; and
a controller coupled to the memory, the controller configured to:
receive a data word to be stored in the memory,
generate error checking and correcting (ECC) information for the data word, the data word and ECC information forming an encoded word, and
distribute bits of the encoded word across the plurality of concurrently accessible memory devices in accordance with one or more indications specifying a number of the bits of the encoded word to store in a wordline of each of the plurality of concurrently accessible memory devices, wherein bits of the data word are to be stored in two or more memory devices of the plurality of memory devices, and bits of the ECC information are to be stored in two or more memory devices of the plurality of memory devices,
wherein the controller is configured to determine a distribution of the bits of the encoded word across the plurality of concurrently accessible memory devices and identify the two or more memory devices of the plurality of memory devices in which the bits of the data word are to be stored and the two or more memory devices of the plurality of memory devices in which the bits of the ECC information are to be stored.

10. The system of claim 9, wherein the one or more indications specify a number of the bits of the ECC information to generate for the data word, and the controller is configured to generate the ECC information in accordance with the one or more indications specifying the number of the bits of the ECC information to generate for the data word.

11. The system of claim 9 wherein the ECC information includes information that protects the encoded word from errors caused by a failure of two memory devices of the plurality of memory devices.

12. The system of claim 9, wherein the controller is configured to interleave the ECC information and the data word.

13. The system of claim 9, wherein the controller is configured to:
distribute the bits of the data word across a first set of memory devices of the plurality of concurrently accessible memory devices, the first set of memory devices including the two or more memory devices of the plurality of memory devices in which the bits of the data word are to be stored and being designated for storing only data bits; and distribute the bits of the ECC information across a second, different set of memory devices of the plurality of concurrently accessible memory devices, the second set of memory devices including the two or more memory devices of the plurality of memory devices in which the bits of the ECC information are to be stored and being designated for storing only ECC bits.

14. The system of claim 9, wherein the controller is configured to distribute the bits of the encoded word such that one or more memory devices of the plurality of concurrently accessible memory devices store both a portion of the data word and a portion of the ECC information.

15. The system of claim 9, wherein the controller is configured to:
interleave the data word and one or more other data words based on the one or more indications specifying the number of the bits of the encoded word to store in the wordline of each of the plurality of concurrently accessible memory devices; and
interleave the ECC information and one or more other ECC information based on the one or more indications specifying the number of the bits of the encoded word to store in the wordline of each of the plurality of concurrently accessible memory devices.

16. The system of claim 9, wherein the controller is configured to determine the distribution of the bits of the encoded word across the plurality of concurrently accessible memory devices and identify the two or more memory devices of the plurality of memory devices in which the bits of the data word are to be stored and the two or more memory devices of the plurality of memory devices in which the bits of the ECC information are to be stored in response to a programming input to the controller.

17. A method, comprising:
receiving a data word to be stored in a memory, the memory including a plurality of concurrently accessible memory devices;
generating error checking and correcting (ECC) information for the data word, the data word and ECC information forming an encoded word;
determining a distribution of bits of the encoded word across the plurality of concurrently accessible memory devices and identifying two or more memory devices of the plurality of memory devices in which bits of the data word are to be stored and two or more memory devices of the plurality of memory devices in which bits of the ECC information are to be stored; and
distributing the bits of the encoded word across the plurality of concurrently accessible memory devices in accordance with one or more indications specifying a number of the bits of the encoded word to store in a wordline of each of the plurality of concurrently accessible memory devices, wherein the bits of the data word are to be stored in the two or more memory devices of the plurality of memory devices, and the bits of the ECC information are to be stored in the two or more memory devices of the plurality of memory devices.

18. The method of claim 17, wherein distributing the bits of the encoded word across the plurality of concurrently accessible memory devices comprises:
distributing the bits of the data word across a first set of memory devices of the plurality of concurrently accessible memory devices, the first set of memory devices including the two or more memory devices of the plurality of memory devices in which the bits of the data word are to be stored and being designated for storing only data bits; and
distributing the bits of the ECC information across a second, different set of memory devices of the plurality of concurrently accessible memory devices, the second set of memory devices including the two or more memory devices of the plurality of memory devices in which the bits of the ECC information are to be stored and being designated for storing only ECC bits.

19. The method of claim 17, wherein distributing the bits of the encoded word across the plurality of concurrently accessible memory devices comprises:
distributing the bits of the encoded word such that one or more memory devices of the plurality of concurrently accessible memory devices store both a portion of the data word and a portion of the ECC information.

20. The method of claim 17, further comprising:
interleaving the data word and one or more other data words based on the one or more indications specifying the number of the bits of the encoded word to store in the wordline of each of the plurality of concurrently accessible memory devices; and
interleaving the ECC information and one or more other ECC information based on the one or more indications specifying the number of the bits of the encoded word to store in the wordline of each of the plurality of concurrently accessible memory devices.

21. The method of claim 17, wherein determining the distribution of the bits of the encoded word across the plurality of concurrently accessible memory devices and identifying the two or more memory devices of the plurality of memory devices in which the bits of the data word are to be stored and the two or more memory devices of the plurality of memory devices in which the bits of the ECC information are to be stored comprises:
determining the distribution of the bits of the encoded word across the plurality of concurrently accessible memory devices and identifying the two or more memory devices of the plurality of memory devices in which the bits of the data word are to be stored and the two or more memory devices of the plurality of memory devices in which the bits of the ECC information are to be stored in response to a programming input to a controller.

* * * * *